United States Patent [19]

Davies

[11] Patent Number: 5,654,863
[45] Date of Patent: Aug. 5, 1997

[54] INTEGRATED CIRCUIT HAVING A GATE OXIDE

[75] Inventor: Neil Davies, Sonnenbuehl-Genkingen, Germany

[73] Assignee: Robert Bosch GmbH, Stuttgart, Germany

[21] Appl. No.: 744,684

[22] Filed: Nov. 7, 1996

Related U.S. Application Data

[63] Continuation of Ser. No. 504,813, Jul. 20, 1995, abandoned.

[30] Foreign Application Priority Data

Jul. 25, 1994 [DE] Germany ............................ 44 26 307.4

[51] Int. Cl.⁶ ...................................................... H02H 9/04
[52] U.S. Cl. ........................... 361/111; 361/56; 361/91; 324/765
[58] Field of Search ............................ 361/56, 111, 91, 361/18; 307/530; 324/765

[56] References Cited

U.S. PATENT DOCUMENTS

| | | | |
|---|---|---|---|
| 4,412,241 | 10/1983 | Nelson | 357/51 |
| 4,809,122 | 2/1989 | Fitzner | 361/18 |
| 4,949,211 | 8/1990 | Edwards | 361/18 |
| 5,341,267 | 8/1994 | Whitten et al. | 361/56 |
| 5,502,399 | 3/1996 | Imai | 324/765 |

*Primary Examiner*—Todd DeBoer
*Attorney, Agent, or Firm*—Kenyon & Kenyon

[57] ABSTRACT

An integrated circuit having a gate oxide, preferably for a DMOS circuit having a protective device against electrostatic overvoltages (ESD), is to connect a limiting circuit in series with the protective device. This series circuit means that, during the wafer production, an increased voltage can be applied to the gate of the integrated circuit, for testing the gate oxide, without the circuit being limited to a lower value. After testing, the limiting circuit is connected irreversibly in its low-resistance state, with the result that subsequent ESD interference voltages are limited by the built-in protective device. A zener zapping diode is provided as the limiting circuit. An advantageous result of the arrangement is the fact that an additional bonding connection for connecting the gate connection to the protective device is no longer necessary.

11 Claims, 1 Drawing Sheet

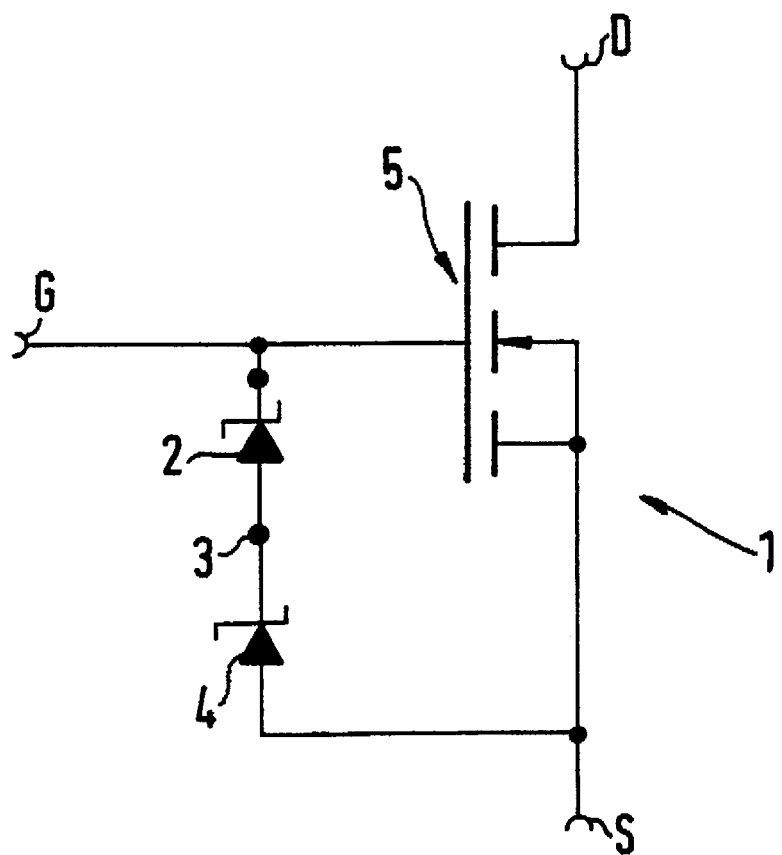

INTEGRATED CIRCUIT HAVING A GATE OXIDE

This is a continuation of application Ser. No. 08/504,813 filed on Jul. 20, 1995 now abandoned.

FIELD OF THE INVENTION

The present invention relates to an integrated circuit having a gate oxide, at the input of which circuit a protective device is provided for protection against electrostatic discharges (ESD).

BACKGROUND INFORMATION

In the production, in particular, of a DMOS wafer, the problem arises that not only the electrical parameters of the integrated circuit but also the gate oxide must be tested for faults. This necessitates an increased voltage, which must be applied to the input (the gate of a DMOS transistor). However, owing to the protective device provided against ESD overvoltages, the input voltage is limited to the predetermined limit value of the protective device.

In order to circumvent this problem, the connection between the protective circuit and the input terminal is initially interrupted in the case of known test methods. After the separation of the chips, the connection is then reestablished during assembly by means of an additional working step. This additional working step causes additional costs. The space requirement for the additional connection on the chip is also relatively large, since corresponding lines having connecting tabs have to be provided, and these require an additional silicon surface area and hence, if appropriate, enlarge the chip.

SUMMARY OF THE INVENTION

The integrated circuit according to the present invention has the advantage that the additional working step, together with the additional connections, is not necessary. This reduces the costs involved in the production of the chip. A further advantage is that the omission of this subsequent connection, which is implemented in the form of a bonding wire, avoids any breaking of the wire at the bonding points. The reliability of the integrated circuit is also advantageously increased thereby.

Zener diodes are advantageous as the protective device, since they are easy to integrate and do not require much space on the chip.

The use of a so-called zener zapping diode as the limiting circuit is particularly advantageous. After the ESD test has been carried out, this zener zapping diode can be destroyed, using a current pulse or a pulse train, in such a way that it develops irreversibly a low resistance. It then corresponds to part of the conductor track.

When the protective device is used in a DMOS circuit, the voltage between the gate and the substrate of the circuit can be advantageously increased in a simple manner, in order to test the relatively sensitive gate oxide. This enables oxide faults to be discovered and such chips to be eliminated.

This arrangement can be advantageously used, in particular, in the case of DMOS power transistors, which are particularly sensitive to ESD voltages. In this way, gate oxide faults which have occurred during the production of the wafer can be discovered very easily and the faulty chips can be marked and sorted out.

BRIEF DESCRIPTION OF THE DRAWING

The FIGURE shows an integrated circuit according to the present invention.

DETAILED DESCRIPTION

The FIGURE shows an exemplary embodiment of an integrated circuit 1 which is designed, in particular, as an MOS or DMOS circuit. It has a transistor 5 which has a drain connection D, a source connection S and a gate connection G. A series circuit of a protective device 4 and a limiting circuit 2 is connected between the connections G and S. The protective device 4 has a zener diode and the limiting circuit 2 has a zener zapping diode. Zener zapping diodes are known per se. They are produced in such a way that they operate initially like a normal zener diode when a relatively small current in the zener range is applied to them. If the current increases above a predetermined limit value, then the zener zapping diode breaks down and remains irreversibly in a state of low resistance. It now acts like part of a conductor track.

The zener zapping diode 2 and the zener diode 4 are connected in the same direction and are connected to the gate connection G in the reverse direction. The protective device 4 is designed according to customary dimensioning rules in such a way that it protects the input circuit from destruction in the event of an electrostatic discharge (ESD). In contrast, the zener zapping diode 2, which is connected to the zener diode 4 via a node 3, is designed in such a way that it becomes effective only during the testing of the gate oxide on the semiconductor wafer.

This additional limiting circuit 2 means that an increased gate voltage can be applied to the input G and consequently the gate oxide of the integrated circuit can be tested for faults or defects. If the test result is positive, that is to say the tested oxide has no defects, then a current or voltage pulse is applied to the zener zapping diode 2 in such a way that it short-circuits and maintains this state permanently. In this case, this load pulse can be supplied to the zener zapping diode 2 via the connection G and, by means of a probe, via the node 3. Alternatively, the load pulse can instead be supplied via the connections G and S. In this case, the limiting circuit 2 is dimensioned in such a way that it alone short-circuits, and not the protective device 4.

The exemplary circuit diagram shown in the figure can be modified, yet still perform the desired functions. In particular, a plurality of partial zener diodes having series- or parallel-connected limiting resistors can be used instead of the zener zapping diode 2. Alternatively, a transistor can be used instead of the zener zapping diode 2, which transistor can be connected to conduct or block via 10 its base.

What is claimed is:

1. An integrated circuit having a gate oxide, comprising:
   a zener diode coupled to an input of the integrated circuit for limiting an input voltage at the input; and
   a limiting circuit for testing the gate oxide and having a zener zapping diode, the zener zapping diode being coupled in series with the zener diode, the zener zapping diode switching irreversibly to a low-resistance state when a zener zapping diode load reaches a predetermined value,
   wherein the zener diode remains active when the gate oxide is tested.

2. The integrated circuit according to claim 1, wherein the input voltage is an electrostatic overvoltage.

3. The integrated circuit according to claim 1, wherein the input is a gate of the integrated circuit.

4. The integrated circuit according to claim 1, wherein the zener diode and the zener zapping diode are arranged in the same direction of current flow.

5. The integrated circuit according to claim 4, wherein a cathode of the zener diode is connected to an anode of the zener zapping diode, a cathode of the zener zapping diode being connected to the input of the integrated circuit.

6. The integrated circuit according to claim 5, wherein the zener zapping diode switches permanently to the low-resistance state in response to at least one current pulse.

7. The integrated circuit according to claim 1, further comprising a DMOS power transistor, a first terminal of the transistor being coupled to the cathode of the zener zapping diode, a second terminal of the transistor being coupled to an anode of the zener diode.

8. The integrated circuit according to claim 1, wherein the limiting circuit is in the low-resistance state when the gate oxide is fault-free.

9. An integrated circuit having a gate oxide, comprising:

a zener diode coupled to an input of the integrated circuit for limiting an input voltage at the input; and a limiting circuit for testing the gate oxide and including a zener zapping diode, the zener zapping diode being coupled in series with the zener diode and allowing an increase of the input voltage provided by the zener diode, the zener zapping diode switching irreversibly to a low-resistance state when a zener zapping diode load reaches a predetermined value, wherein the zener diode remains active when the gate oxide is tested.

10. An integrated circuit having a gate oxide, comprising:

a zener diode coupled to an input of the integrated circuit for limiting an input voltage at the input; and a zener zapping diode switching irreversibly from a high-resistance state to a low-resistance state when a zener zapping diode load reaches a predetermined value, the zener zapping diode being coupled in series with the zener diode, wherein the zener zapping diode, during the high-resistance state, allows an increase of the input voltage limited by a sum of a zener zapping diode voltage and a zener diode voltage, and wherein the zener zapping diode, during the low-resistance state, allows the increase of the input voltage limited by the zener diode voltage.

11. The integrated circuit according to claim 10, wherein the zener diode remains active when the gate oxide is tested.

* * * * *